United States Patent [19]

Bosnyak et al.

[11] Patent Number: 5,446,686
[45] Date of Patent: Aug. 29, 1995

[54] METHOD AND APPARTUS FOR DETECTING MULTIPLE ADDRESS MATCHES IN A CONTENT ADDRESSABLE MEMORY

[75] Inventors: Robert J. Bosnyak; Mark R. Santoro, both of Sunnyvale, Calif.

[73] Assignee: Sun Microsystems, Inc., Mountain View, Calif.

[21] Appl. No.: 285,013

[22] Filed: Aug. 2, 1994

[51] Int. Cl.$^6$ .............................................. G11C 15/00
[52] U.S. Cl. ................................. 365/49; 365/189.07; 365/210
[58] Field of Search .................. 365/49, 189.07, 210; 395/425

[56] References Cited

U.S. PATENT DOCUMENTS

| | | | |
|---|---|---|---|
| 3,634,829 | 1/1972 | Campi | 395/775 |
| 3,706,078 | 12/1972 | Hilberg | 365/194 |
| 4,084,260 | 4/1978 | Fleming et al. | 365/49 X |
| 4,163,288 | 7/1979 | Vinot | 365/49 X |
| 4,670,858 | 6/1987 | Almy | 365/49 |
| 4,888,731 | 12/1989 | Chuang et al. | 365/49 |
| 5,036,486 | 7/1991 | Noguchi et al. | 365/49 |
| 5,218,567 | 6/1993 | Suzuki et al. | 365/49 X |

OTHER PUBLICATIONS

Kohonen, T., "Content-Addressable Memories", Second Edition, Springer-Verlag, 1980 and 1987, pp. 136-143, 348-349.

Ogura, T., et al., "A 4-kbit Associative Memory LSI", IEEE Journal of Solid-State Circuits, vol. SC-20, No. 6, Dec. 1985, pp. 1277-1282.

Kadota, H., et al., "An 8-kbit Content-Addressable and Reentrant Memory", IEEE Journal of Solid-State Circuits, vol. SC-20, No. 5, Oct. 1985, pp. 951-957.

*Primary Examiner*—David C. Nelms
*Assistant Examiner*—Son Dinh
*Attorney, Agent, or Firm*—Limbach & Limbach

[57] ABSTRACT

A circuit for detecting multiple address matches in an associative array includes a match current generator that responds to active match signals generated by the associative array by generating a match current that is linearly proportional to the number of active match signals generated by the array. A reference current source generates a reference current that is between one and two times greater than the match current when a single active match signal is generated by the associative array. A comparator compares the match current and the reference current and generates an active output signal when the match current is greater than the reference current.

7 Claims, 4 Drawing Sheets

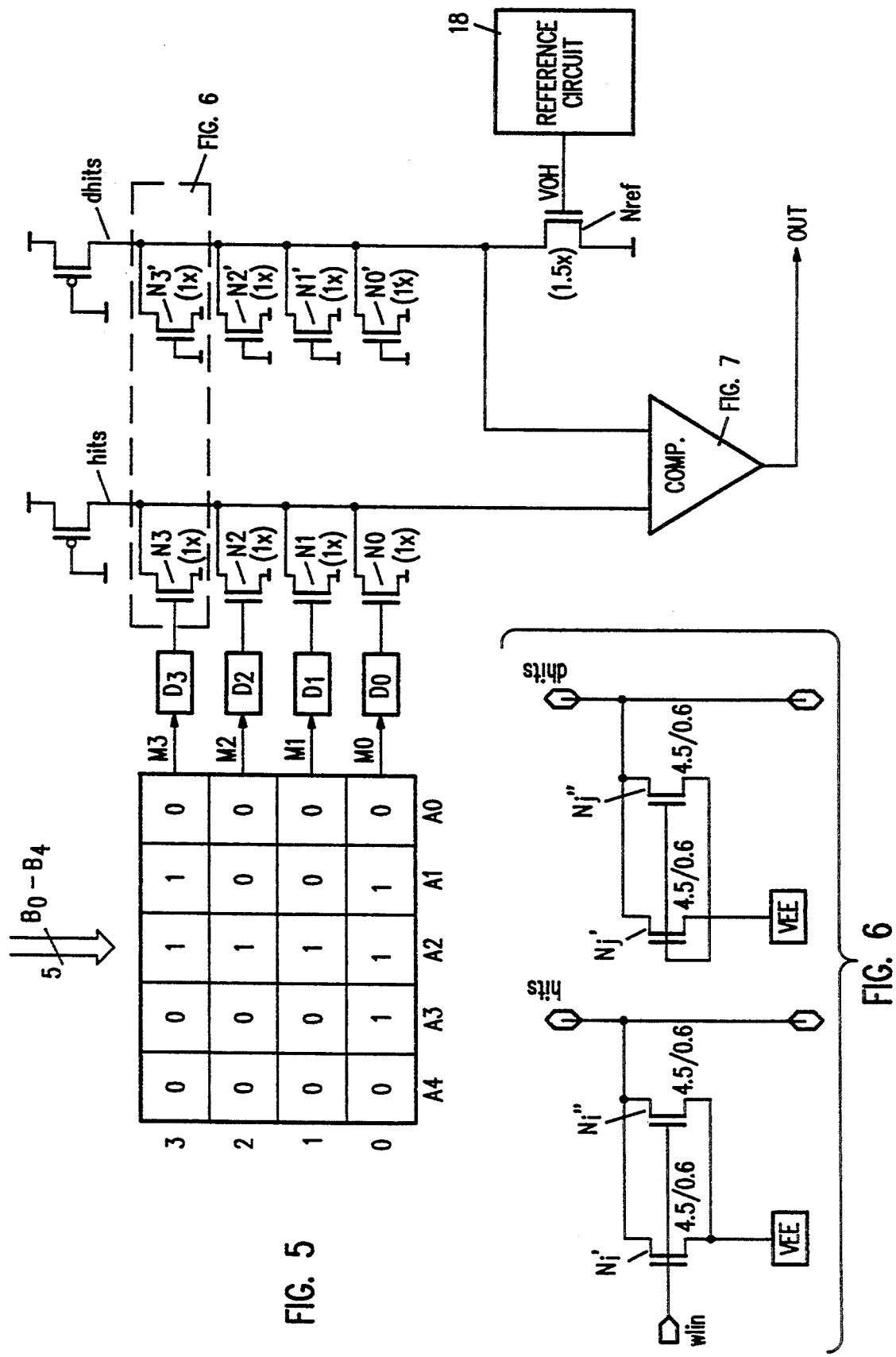

METHOD AND APPARTUS FOR DETECTING MULTIPLE ADDRESS MATCHES IN A CONTENT ADDRESSABLE MEMORY

BACKGROUND OF THE INVENTION

1. Field of the Invention

The present invention relates to content-addressable memories (CAM) and, in particular, to methods and apparatus for detecting multiple matches in the associative array of a content addressable memory used for a translation look-aside buffer.

2. Discussion of the Prior Art

Content addressable memories are used in a variety of applications ranging from sorting large databases to image recognition. In a content addressable memory, a multi-bit boolean data word is broadcasted to an associative array. The associative array compares the incoming data word to each of the data words stored in the rows of the array. When a match occurs, that is, when the bits of the input word match the bits of a word stored in any row of the associative array, a match signal is generated that is used to address a secondary array.

Under certain conditions, multiple matches can occur in the associative array. For example, if the system software is poorly written, it can cause redundant words to appear in the array. Hardware can, through random start-up states or several other well-known mechanisms, fail to write or retain unique data in the array. Furthermore, alpha particles, a random event, may cause memory cells in the associative array to change state.

In some applications, multiple matches in the associative array are acceptable and additional circuitry is provided to resolve that condition. However, other applications, such as microprocessors, are not so forgiving.

A content addressable memory is typically used in a microprocessor to create a look-up table, commonly referred to as a translation look-aside buffer (TLB), that relates local or cache memory data to some hierarchical location in the microprocessor's main memory. In the most simple form, if data has been transferred from main memory to a local cache memory, then the central processing unit needs to know that the data is stored locally. To make this determination, part of the address of the data from main memory is compared in the content addressable memory. If there is a match or "hit", that data plus the address that is generated from the CAM's secondary array, is used to inform the CPU where to find the data. This look-up mechanism must be unique. That is, a translation from cache memory and main memory can have no ambiguity. Therefore, either a no-hit or single hit situation are the only two possible states that will be tolerated.

FIG. 1 shows an example of a four word associative array with a five bit word width. In the FIG. 1 example, when an incoming five bit data word $B_0$–$B_4$ is broadcasted to the associative array, the bits at each site in the array are checked en-masse. That is, the following logic is solved for each storage site in the array:

An xor Bn=Mn

Where An is the stored bit value in column n of a row in the associative array and Bn is the broadcasted bit at column n.

A word match signal MATCH can then be generated as follows:

*M0 and M1 and M2 and M3 and M4 = MATCH*

That is, if all the individual bits in a row of the associative array match the broadcasted word, then the MATCH signal active state is generated for that row. In the FIG. 1 example, if the broadcasted word $B_0$–$B_4$ consists of the bit sequence 00101, then word two (WORD2) in the associative array is uniquely matched.

The match signal out of the associative array addresses a secondary array, as shown in FIG. 2. More specifically, when a match occurs in the associative array, the active match signal generated for the matched row turns on an associated row driver to the secondary array. For example, if WORD2 is a match in the associative array, then its associated driver D2 is turned on. Note that a "no match" state could be easily determined by forming the logical "OR" of all of the match signal outputs of the associative array. A no match condition is equal to a false or "0" output. Further note that two or more matches in the associative array cause two or more row drivers to be turned on, a situation that leaves the outputs $C_0$–$C_3$ of the secondary array in an ambiguous state.

One of the consequences of a multiple match malfunction in the TLB of a microprocessor is that it can take several processor clock cycles to detect. These malfunctions are hard to trouble shoot, since the states of the processor move further away from the error state with each clock cycle prior to detection. Initialization of the software to detect multiple matches on the fly adds overhead to system operation, thus slowing the system down.

In addition to system malfunction from a software standpoint, the driver circuit and power supply distribution mechanism of the translation look-aside buffer may be over-stressed due to the multiple matches. Since driver speed is very critical to fast system operation, a greater relative power is used on the driver circuit. If two or more drivers are on at any given time, these circuits and their supply traces are over-stressed with large current densities. This may cause other circuits to operate in an undesired mode, or, in the worst case, can lead to catastrophic failure of the circuit.

Existing solutions to the problem of multiple match detection in an associative array rely on either sequential detection mechanisms, inhibiting operations, or binary search techniques. Each of these solutions requires extra circuitry in the critical circuit path, requires a relatively long time to resolve the problem, and uses a relatively large amount of chip area to implement.

SUMMARY OF THE INVENTION

The present invention provides a circuit for detecting multiple matches in an associative array utilizing analog techniques in a digital circuit. The circuit relies on saturation current matching and coordination between an accurate reference and matched current sinks. Minor mismatches are compensated for and temperature effects are minimized. The area of the detection circuit is small compared with pure logical circuits and the circuit is much faster. The chip is protected from damage and software de-bugging is improved.

A circuit for detecting multiple matches in accordance with the present invention includes a match current generator that responds to active match signals generated by an associative array by generating a match current that is linearly proportional to the number of active match signals. A reference current source generates a reference current that is between one and two times, preferably 1.5 times, greater than the match current generated by the match current generator when a single active match signal is generated by the associative array. A comparator compares the match current and the reference current and generates an active output signal when the match current is greater than the reference current.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

FIG. 5 is a more detailed schematic diagram illustrating an embodiment of a circuit for detecting multiple matches in an associative array in accordance with the present invention.

FIG. 6 is a schematic diagram illustrating a match circuit that is replicated at each match row site in the circuits shown in FIGS. 3 and 4.

DETAILED DESCRIPTION OF THE INVENTION

Figure 1:
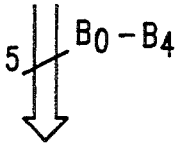
FIG. 1 is a block diagram illustrating a conventional associative array of a content addressable memory.
Figure 2:
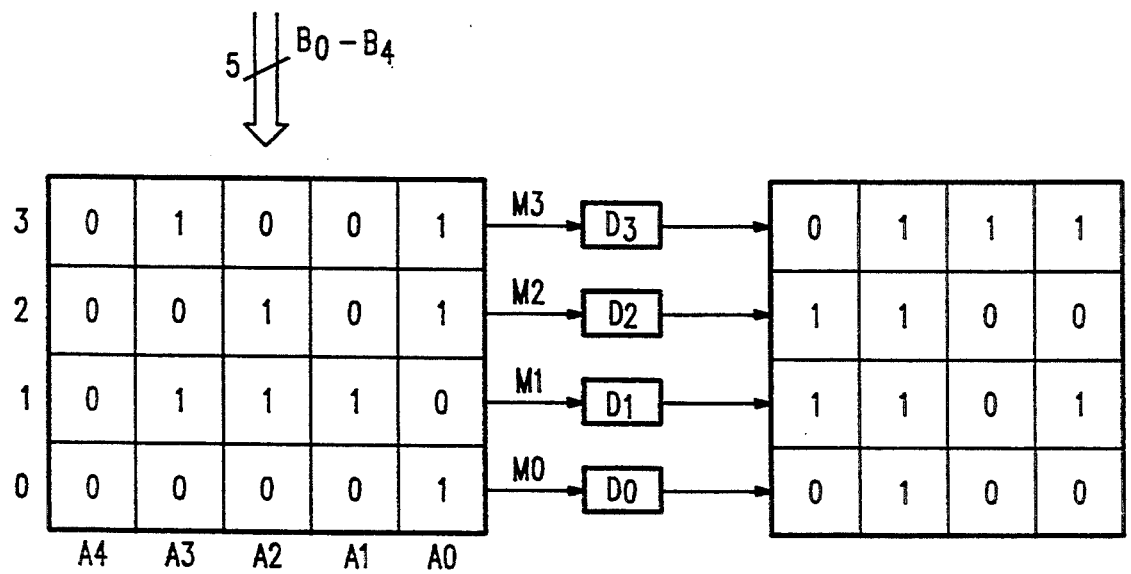
FIG. 2 is a block diagram illustrating an associative array, match drivers and secondary array of a conventional memory.
Figure 3:
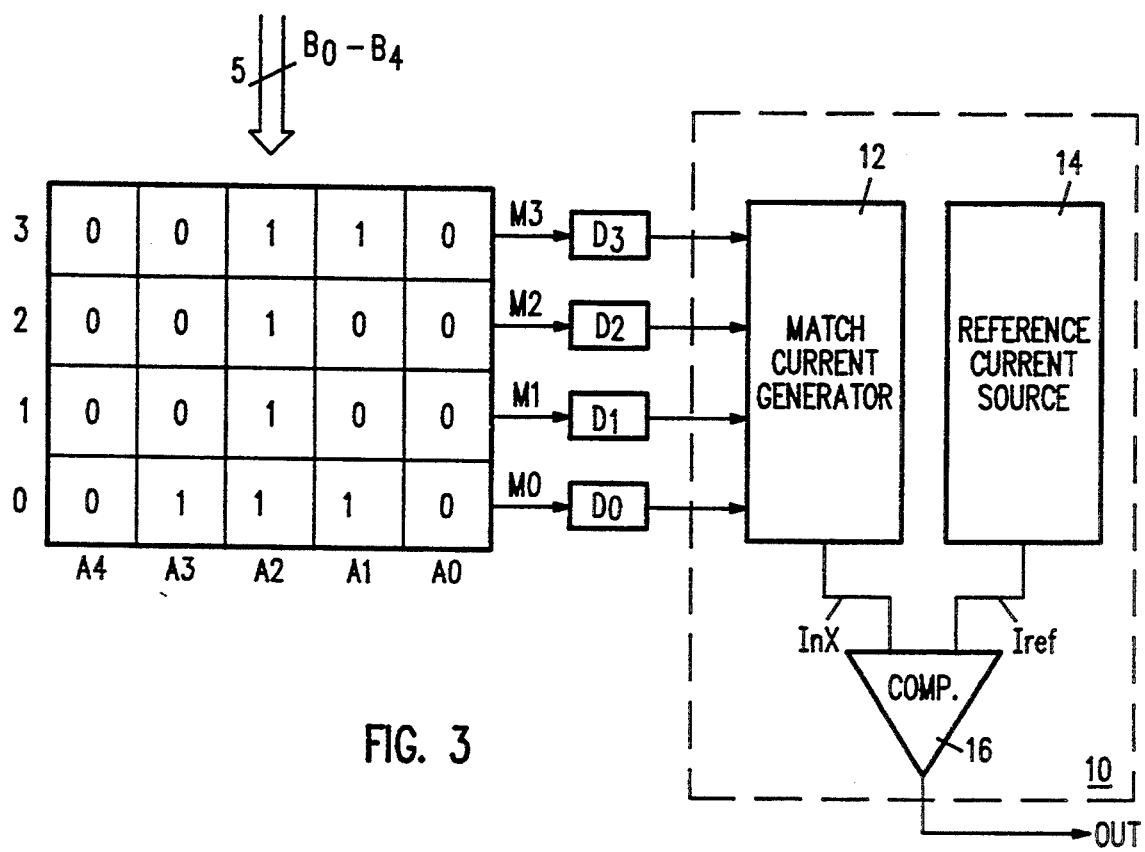
FIG. 3 is a block diagram illustrating a circuit for detecting multiple matches in an associative array in accordance with the present invention.

FIG. 3 shows a detection system 10 for detecting multiple matches in a four word associative array with each word having a five bit word width. An input signal B, comprising five bits $B_0$–$B_4$ with a particular bit pattern, is broadcasted to the associative array. The bits at each site in the associative array are checked to determine whether a word match exists in any of the rows of the array. If a match occurs in one or more rows of the array, then the array provides an active match signal for each matched row. Each active match signal turns on a corresponding driver $D_0$–$D_3$ associated with that matched row. The circuitry and methods utilized to implement the associative array and for generating the active match signals are well known to those skilled in the an and are not considered to be part of the present invention. The drivers $D_0$–$D_3$ also may be of conventional design.

In accordance with the invention, the output of each of the individual drivers $D_0$–$D_3$ is provided to a match current generator 12 of the detection system 10. The match current generator 12 responds to the active match signals generated by the associative array by generating a match current signal InX that is linearly proportional to the number of active match signals generated by the associative array. That is, X equals the number of rows in the associative array matching the broadcasted input signal B.

As shown in FIG. 3, the system 10 also includes a reference current source 14 that generates a reference current $I_{ref}$ that is between one and two times greater than the match current InX generated by the match current generator 12 when only a single active match signal is generated by the associative array, i.e., when X equals 1.

As further shown in FIG. 3, the match current InX and the reference current $I_{ref}$ are provided as inputs to a comparator 16. The comparator 16 generates an active output signal OUT when the match current InX is greater than the reference current $I_{ref}$.

Figure 4:
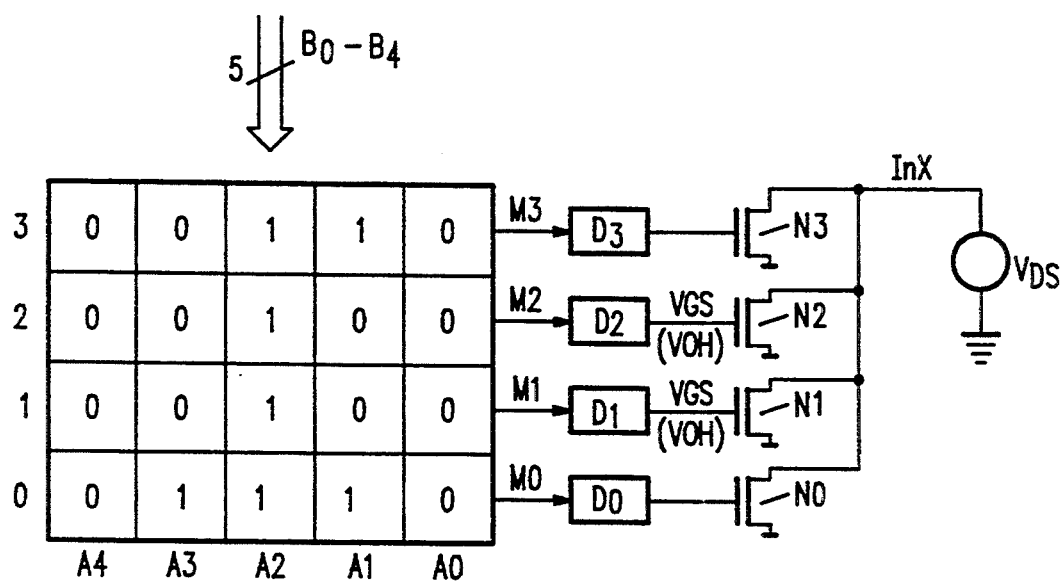
FIG. 4 is a schematic diagram illustrating an embodiment of a circuit for detecting multiple matches in an associative array in accordance with the present invention.

FIG. 4 shows an embodiment of a match current generator 12 that utilizes an analog technique that requires the system 10 to have only a small overhead amount of circuitry, that yields a multi-match signal if two or more matches occur in the associative array, and that outputs the multi-match signal within one clock cycle.

As shown in FIG. 4, each active match signal generated by the associative array turns on an associated driver $D_0$–$D_3$ that produces an output signal at a Voltage Output High (VOH) level. For example, if the input signal B is 00100, then WORD1 and WORD2 in the FIG. 4 associative array each provide an active match signal. Note that by virtue of WORD1 and WORD2 matching the broadcasted input signal B, drivers $D_1$ and $D_2$ are high, i.e., at VOH. Using the VOH signal as a gate voltage Vgs for NMOS transistors $N_1$ and $N_2$ associated with the matched rows, and assuming that the region of operation of NMOS transistors $N_0$–$N_3$ is forced to be in the saturation region, then the drain current of each NMOS transistor is defined as:

$$Idsat = K*(W/L)*(Vgs-Vth)2$$

Where

K is a process constant
W is the width of the NMOS transistor gate
L is the length of the NMOS transistor gate
Vgs is the gate to source voltage
Vth is the threshold voltage of the NMOS transistor Note that, in the FIG. 4 embodiment, the VOH of the driver becomes the Vgs of the NMOS transistor associated with that driver. Thus, for each match in the associative array, the total current InX flowing from the series connected drains of the NMOS transistors $N_0$–$N_3$ = n*Idsat. Thus, InX = n*K*(W/L)*(Vgs−Vth)2.
Substituting VOH for Vgs,
InX = n*K*(W/L)*(VOH−Vth)2 where n is the number of matches occurring in the associative array

For example, if VOH is 2.4 volts and Vds is 5.0 volts, thus forcing the NMOS transistors $N_0$–$N_3$ into the saturation region, and Idsat is 200 ua, then

| n | Imm |
| --- | --- |
| 0 | 0 |
| 1 | 200 ua |
| 2 | 400 ua |

-continued

| n | Imm |
|---|---|
| 3 | 600 ua |
| >3 | >600 ua |

Note that 0 through 2 matches is the operation of interest.

Referring to FIG. 5, as stated above, a reference current $I_{ref}$ is set up to reflect an Idsat of InX for n=1.5. As shown in FIG. 5, this is accomplished by replicating the NMOS transistors $N_0$–$N_3$ utilized to generate Idsat at 1.5× the size of the individual NMOS $N_0$–$N_3$ transistors. (Those skilled in the art will appreciate that n can be between 1 and 2, but that n=1.5 is preferred for maximum noise margin.) The Vgs of the reference transistor $N_{ref}$ is then biased at the same VOH output level of the driver VOH. Furthermore, the temperature and supply characteristics of the reference transistor Vgs are also matched. This is accomplished utilizing a reference circuit 18 that, as will be appreciated by those skilled in the art, must be a close replication of the match row drivers $D_0$–$D_3$ and that reflects appropriate temperature and voltage supply compensation.

As shown in FIG. 5, the match current InX and the reference current $I_{ref}$ are provided to the comparator 16. The comparator 16 provides an active output when the match current InX is greater than the reference current $I_{ref}$. A preferred embodiment of the comparator 16 will be described in greater detail below in conjunction with FIG. 7.

As further shown in FIG. 5, sub-threshold compensation and AC load matching for the NMOS transistors $N_0$–$N_3$ are provided by duplicate NMOS transistors $N_0'$–$N_3'$ that are biased off. Thus, as the IC substrate and local wires of the detection circuit move, capacitive coupling is the same for both sides of the comparator 16, thus reducing noise. The parallel-connected duplicate transistors $N_0'$–$N_3'$ are also connected to the positive supply via a PMOS load.

FIG. 6 shows a match circuit that is replicated at each match row site of the associative array. The NMOS transistors $N_i'$ and $N_i''$ on the left of FIG. 6 are the current sinks weighted to one match row on. The NMOS transistors $N_j'$ and $N_j''$ on the right of FIG. 6 are reference matching transistors that improve the DC comparison operation by balancing leakage currents (sub-threshold currents) and provide resistance and capacitive paths for improving common mode noise rejection. When the input to the left side transistors ($N_i'$ and $N_i''$) is forced high by a match row line driver, the "hits" lines sinks one current load Idsat.

The pitch of the FIG. 6 match circuits should be the same pitch as that of the word lines of the associative array. Also, the layout of the left "hits" side of the match circuit should be identical to the layout of the right "dhits" side. The overall resistance of the "hits" and "dhits" lines should matched and be made as small as possible for a given technology.

Figure 7:
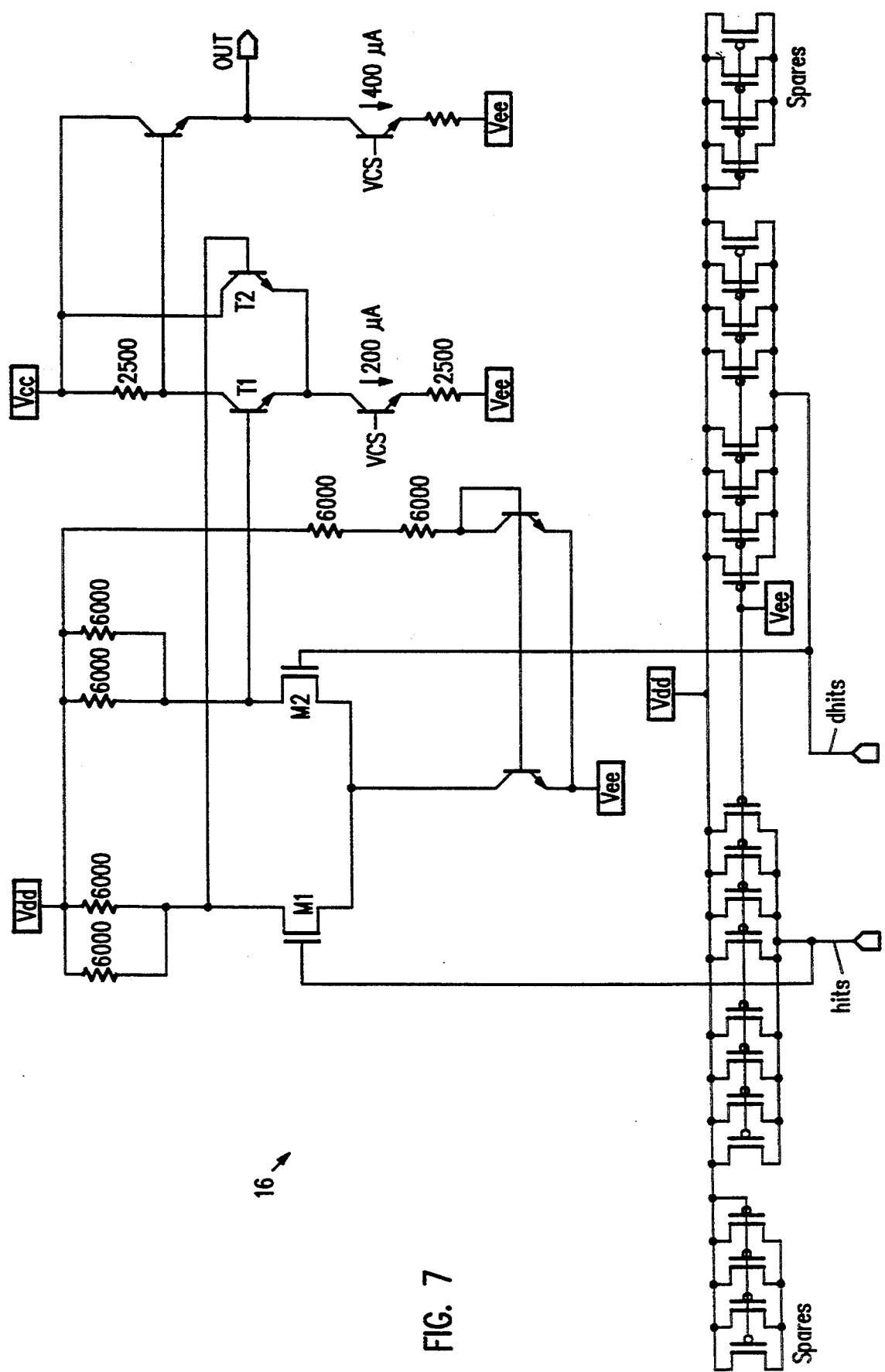
FIG. 7 is a schematic diagram illustrating a comparison circuit that loads and compares the hits and dhits lines of the FIG. 4 circuit.

FIG. 7 shows an embodiment of an analog comparison circuit 16 that loads and compares the "hits" and "dhits" lines of the FIG. 5 circuit. The comparison circuit 16 is a two stage differential amplifier with a wide range of common mode input voltages. To accomplish the wide swings on the "hits" and "dhits" lines, the first stage of the differential amplifier is a CMOS differential pair (M1, M2). The second stage utilizes npn transistors $T_1$ and $T_2$ to buffer the signal out of the first stage to an ECL level, adding gain and translating the output signal OUT to a useful level for subsequent operations. FIG. 7 shows the PMOS loads for the "hits" and "dhits" lines implemented with multiple PMOS devices with spares for tighter control under varying process conditions.

While the present invention has been described in relationship to the embodiments described in the accompanying specification, other alternatives, embodiments and modification will be apparent to one skilled in the art. It is intended that the specification be only exemplary, and that the true scope and spirit of the invention be indicated by the following claims.

What is claimed is:

1. A detection circuit for detecting multiple matches in an associative array, wherein the associative array includes a plurality of rows of storage elements such that each row stores one or more boolean data bits defining a boolean data word, the associative array including comparison circuitry for comparing a boolean input signal broadcasted to the associative array to the boolean data words stored in the associative array to determine whether there is a match in one or more rows of the associative array, a match in any row causing the comparison circuitry to generate an active match signal for that row, the detection circuit comprising:

a match current generator that responds to active match signals generated by the associative array by generating a match current that is linearly proportional to the number of active match signals generated by the associative array;

a reference current source that generates a reference current that is between one and two times greater than the match current generated by the match current generator when only one active match signal is generated by the associative array; and a comparator that compares the match current and the reference current and generates an active output signal when the match current is greater than the reference current.

2. A detection circuit as in claim 1 wherein the reference current is about 1.5 times greater than the match current generated by the match current generator when only one active match signal is generated by the associative array.

3. A detection circuit for detecting multiple matches in an associative array, wherein the associative array includes a plurality of rows of storage elements such that each row stores one or more boolean data bits defining a boolean data word, the associative array including comparison circuitry for comparing a boolean input signal broadcasted to the associative array to boolean data words stored in the associative array to determine whether there is a match in one or more rows of the associative array, a match in any row causing the comparison circuitry to generate an active match signal for that row, the active match signal having a predefined voltage level, the detection circuit comprising:

first and second PMOS load transistors connected to a positive supply;

a comparator having first and second inputs;

for each row of the associative array, an NMOS match transistor having its gate connected to receive an active match signal provided by said row, the NMOS match transistors being connected in parallel between the first PMOS load and the first input of the comparator such that operation of the NMOS transistors is forced to be in the saturation region, each of the NMOS transistors having the same W/L (width/length) ratio such that the parallel-connected NMOS transistors respond to active match signals generated by the associative array by providing to the first input of the comparator a match current that is linearly proportional to the number of active match signals generated by the associative array;

a reference voltage generator that generates an output bias signal having a voltage level substantially equal to the predefined voltage level of the active match signal; and a NMOS reference transistor having a W/L ratio that is about 1.5 times the W/L ratio of the NMOS match transistors, the reference transistor having its source connected to the negative supply, its gate connected to receive the output bias signal from the reference voltage generator, and its drain coupled to the second PMOS load transistor and also connected to the second input of the comparator to provide a reference current thereto, whereby the reference current is about 1.5 times greater than the match current provided to the first input of the comparator when only one active match signal is generated by the associative array, whereby the comparator compares the match current and the reference current and generates an active output signal when the match current is greater than the reference current.

4. A detection circuit as in claim 3 and further comprising compensation circuitry connected to the second input of the comparator for equalizing capacitive coupling at the first and second inputs of the comparator.

5. A detection circuit as in claim 3 and further comprising, for each NMOS match transistor, a corresponding NMOS duplicate transistor having the same W/L (width/length) ratio as said NMOS match transistor, the NMOS duplicate transistors being connected in parallel between the second PMOS load transistor and the second input of the comparator for equalizing capacitive coupling at the first and second inputs of the comparator.

6. A method of detecting multiple matches in an associative array, wherein the associative array includes a plurality of rows of storage elements such that each row stores one or more boolean data bits defining a boolean data word, the associative array including comparison circuitry for comparing a boolean input signal broadcasted to the associative array to the boolean data words stored in the associative array to determine whether there is a match in one or more rows of the associative array, a match in any row causing the comparison circuitry to generate an active match signal for that row, the method comprising:

generating a match current that is linearly proportional to the number of active match signals generated by the associative array;

generating a reference current that is between one and two times greater than the match current generated when only one active match signal is generated by the associative array;

comparing the match current and the reference current; and generating an active signal when the match current is greater than the reference current.

7. A method as in claim 6 wherein the reference current is about 1.5 times greater than the match current generated when only one active match signal is generated by the associative array.

* * * * *